United States Patent
Kohlrausch et al.

(10) Patent No.: US 9,799,210 B2
(45) Date of Patent: Oct. 24, 2017

(54) APPARATUS AND METHOD FOR IMPROVING THE AUDIBILITY OF SPECIFIC SOUNDS TO A USER

(71) Applicant: KONINKLIJKE PHILIPS N.V., Eindhoven (NL)

(72) Inventors: Armin Gerhard Kohlrausch, Eindhoven (NL); Mun Hum Park, Eindhoven (NL); Sam Martin Jelfs, Riethoven (NL); Thomas Falck, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/769,122

(22) PCT Filed: Mar. 12, 2014

(86) PCT No.: PCT/EP2014/054757
§ 371 (c)(1),
(2) Date: Aug. 20, 2015

(87) PCT Pub. No.: WO2014/140053
PCT Pub. Date: Sep. 18, 2014

(65) Prior Publication Data
US 2016/0005308 A1 Jan. 7, 2016

Related U.S. Application Data (60) Provisional application No. 61/778,729, filed on Mar. 13, 2013.

(30) Foreign Application Priority Data

Apr. 5, 2013 (EP) ..................................... 13162514

(51) Int. Cl.
*G08B 29/28* (2006.01)
*H03G 3/32* (2006.01)
(Continued)

(52) U.S. Cl.
CPC ............... *G08B 29/28* (2013.01); *G08B 3/10* (2013.01); *H03G 3/32* (2013.01); *H04R 3/04* (2013.01);
(Continued)

(58) Field of Classification Search
CPC ......... H03G 9/025; H03G 3/32; H04R 1/1083
(Continued)

(56) References Cited

U.S. PATENT DOCUMENTS 4,254,303 A 3/1981 Takizawa
5,077,799 A 12/1991 Cotton
(Continued)

FOREIGN PATENT DOCUMENTS

| EP | 2088802 A1 | 8/2009 |
|---|---|---|
| FR | 2529727 A1 | 1/1984 |
| WO | 2014136069 A2 | 9/2014 |

OTHER PUBLICATIONS

Breebaart, J., et al.; Binaural processing model based on contralateral inhibition; I. Model structure; 2001; J. Acoust. Soc. Am.; 110(2)1074-1088.
(Continued)

*Primary Examiner* — George Monikang (57) ABSTRACT

There is provided a method of operating a device to generate a target sound that is audible to a user of the device, the method comprising measuring background noise in an environment in which the device is located; using a perceptual loudness model to predict an audibility of the target sound to the user of the device based on the measured background noise; using the output of the perceptual loudness model to determine a gain value that is to be applied to a source signal used to generate the target sound in order to provide at least a desired level of audibility of the target sound to the user; applying the determined gain value to the source signal to
(Continued)

produce a modified source signal; and generating the target sound using the modified source signal.

19 Claims, 6 Drawing Sheets

(51) Int. Cl.
*H04R 3/04* (2006.01)
*G08B 3/10* (2006.01)
*H04R 29/00* (2006.01)
*H04R 27/00* (2006.01)

(52) U.S. Cl.
CPC ............ *H04R 29/00* (2013.01); *H04R 29/007* (2013.01); *H04R 27/00* (2013.01); *H04R 2227/001* (2013.01); *H04R 2430/01* (2013.01)

(58) Field of Classification Search
USPC .............. 381/71.1, 94.1, 104, 105, 106, 107
See application file for complete search history.

(56) References Cited

U.S. PATENT DOCUMENTS

| 5,444,783 | A | 8/1995 | Na |
| 7,245,226 | B1 | 7/2007 | Thanhauser et al. |
| 8,897,840 | B1* | 11/2014 | Hyde .................... H04M 19/04 381/101 |
| 2008/0161063 | A1 | 7/2008 | Schuster et al. |
| 2009/0146799 | A1 | 6/2009 | Goldstein et al. |
| 2010/0158275 | A1 | 6/2010 | Zhang et al. |
| 2011/0169721 | A1* | 7/2011 | Bauer ................. G10L 21/0208 345/84 |
| 2011/0305346 | A1* | 12/2011 | Daubigny ................ H03G 3/32 381/28 |
| 2012/0039489 | A1 | 2/2012 | Chen et al. |
| 2014/0254808 | A1 | 9/2014 | Park et al. |
| 2014/0275856 | A1 | 9/2014 | Kohlrausch et al. |

OTHER PUBLICATIONS

Dau, T., et al.; A quantitative model of the "effective" signal processing in the auditory system. I. Model structure; 1996; J. Acoust. Soc. Am.; 99(6)3615-3622.

Moore, B. C. J., et al.; A Model for the Prediction of Thresholds, Loudness, and Partial Loudness; 1997; J. Audio Eng. Soc.; 45(4)224-240.

Stuart, "Noise: Methods for Estimating Detectability and Threshold", J. Audio Eng. Soc., vol. 42, No. 3, Mar. 1994, pp. 124-140.

* cited by examiner

APPARATUS AND METHOD FOR IMPROVING THE AUDIBILITY OF SPECIFIC SOUNDS TO A USER

CROSS REFERENCE TO RELATED APPLICATIONS

This application is a national filing of PCT application Ser. No. PCT/EP2014/054757, filed Mar. 12, 2014, published as WO 2014/140053 A1 on Sep. 18, 2014, which claims the benefit of U.S. provisional application Ser. No. 61/778,729 filed Mar. 13, 2013 and EP provisional application Ser. No. 13162514.7 filed Apr. 5, 2013, both of which are incorporated herein by reference.

TECHNICAL FIELD OF THE INVENTION

The invention relates to an apparatus that generates a specific or predetermined sound, for example an alarm, and in particular to an apparatus and method of operating the same that generates the specific or predetermined sound so that it is audible to a user of the apparatus over any background noise in the environment in which the apparatus and user are located.

BACKGROUND TO THE INVENTION

Many medical devices used in intensive care units of hospitals provide acoustic (audible) alarms, if specific conditions or events occur. The medical device or devices are typically arranged near to a patient's bed and are provided for monitoring one or more physiological characteristics of a patient, such as heart rate, blood pressure, breathing rate, blood oxygen levels, etc, and/or for providing some treatment to a patient, such as controlling the administration of an intravenous drug, assisting the patient's breathing, etc. The specific conditions that lead to alarms being triggered can refer to, for example, abnormal values of the physiological characteristics of the patient or specific operating states or error states of the device.

The alarms issued by these devices are primarily for the attention of the healthcare staff in the hospital and serve to acoustically alert staff members to direct their attention to the device and take any appropriate or required action. Although the alarm sound level for a particular medical device may be able to be set by the end users (the healthcare staff) to specific levels, these levels will typically stay fixed after being set during installation, which means that alarm sounds are played with a fixed absolute sound power level. This level will have been set sufficiently high to hopefully guarantee that healthcare staff will be alerted despite the background noise in the environment in which the medical device is being used potentially being quite high (for example if many staff members are speaking simultaneously and/or if there are lots of noisy medical devices being used, which may themselves be issuing alarms). However, this means that the alarm can be much louder than necessary when there are low background noise levels, such as at night. Due to their function of raising auditory attention, these sounds are also well-suited to arouse patients during sleep, leading to sleep fragmentation, anxiousness about the meaning of the sounds, or just annoyance if the alarms are not acted on for a long period.

As the number of individual acoustic alarms being generated in such an environment (particularly in an intensive care unit) at any one time can be very high, these sounds can contribute in many cases to a highly stressful situation for the healthcare staff as well as for any nearby patients. It has been found that such stress overload can lead to staff suffering from "alarm fatigue" where a staff member is no longer able to react appropriately to the alarms, and in some cases can lead to staff members ignoring the alarms altogether.

Therefore, there is a need for an apparatus and method of operating the same that generates a specific or predetermined sound, for example an alarm, which reduces the potential negative impacts of alarm sounds on patients and healthcare staff outlined above, while ensuring that the alarm sounds remain highly audible without being unnecessarily loud.

SUMMARY OF THE INVENTION

To provide an audible target sound over background noise, there is provided, according to a first aspect of the invention, a method of operating a device to generate a target sound that is audible to a user of the device, the method comprising: measuring the background noise in the environment in which the device is located; using a perceptual loudness model to predict the audibility of the target sound to a user of the device based on the measured background noise; using the output of the perceptual loudness model to determine a gain value that is to be applied to a source signal used to generate the target sound in order to provide at least a desired level of audibility of the target sound to the user; applying the determined gain value to the source signal to produce a modified source signal; and generating the target sound using the modified source signal.

Preferably, the step of using the perceptual loudness model comprises computing a measure of the loudness of the target sound in view of the measured background noise. The measure of the loudness is preferably the partial loudness, perceived loudness or a signal-to-background noise ratio.

Preferably, the perceptual loudness model is used to predict a first threshold at which the target sound becomes audible to the user, and to predict how the audibility of the target sound to the user increases as the volume of the target sound increases.

Preferably, the step of using the output of the perceptual loudness model comprises using the prediction of how the audibility of the target sound to the user increases as the volume of the target sound increases to determine the level or volume required for the target sound in order to achieve at least a desired level of audibility for the target sound.

Preferably, the step of using the output of the perceptual loudness model further comprises determining the gain value appropriate for the determined level or volume required for the target sound.

In some embodiments, the step of using the output of the perceptual loudness model to determine a gain value comprises using a look-up table that provides the gain value required for the predicted audibility of the target sound and the measured background noise.

In some embodiments, the step of using a perceptual loudness model to predict the audibility of the target sound comprises evaluating how audible the target sound would be for a specific gain value and the measured background noise.

In other embodiments, the step of using the output of the perceptual loudness model to determine a gain value comprises using the output of the perceptual loudness model to determine an initial gain value to be applied to the source signal that results in a perceived loudness of zero; and extrapolating the initial gain value to a gain value that has an above-zero perceived loudness.

In some embodiments, the step of using a perceptual loudness model to predict the audibility of the target sound comprises using the perceptual loudness model to compute a perceived loudness of the target sound from the measured background noise and a composite signal formed by adding the source signal for the target sound to the measured background noise.

In particular embodiments, the step of using a perceptual loudness model is repeated after a gain value is determined in the step of using the output of the perceptual loudness model to determine a gain value, and wherein when the step of using a perceptual loudness model is repeated the composite signal is formed by applying the gain value to the source signal for the target sound to produce an intermediate modified signal and adding the intermediate modified signal to the measured background noise.

In some embodiments, the method further comprises pre-processing the source signal in order to account for the acoustic path between a speaker of the device and the means provided in the device for measuring the background noise.

In preferred embodiments, in the event that the method is performed when the device is already generating the target sound, the step of measuring the background noise in the environment in which the device is located comprises measuring the sound in the environment in which the device is located; and filtering or subtracting the source signal for the target sound from the measured sound to give the measured background noise. This embodiment prevents the target sound being generated by the device from forming part of the background noise.

In preferred embodiments, the step of measuring the background noise in the environment in which the device is located further comprises measuring the sound in the environment in which the device is located; processing the measured sound to identify target sounds generated by other devices; and in the event that target sounds generated by other devices are identified in the measured sound, processing the measured sound to remove said target sounds generated by other devices to give the measured background noise. This embodiment prevents target sounds (e.g. alarms) that are being generated by other devices according to the invention from being included in the background noise, which therefore prevents the presence of those target sounds and the target sound generated by the present device in the environment from leading to mutual amplification of the target sounds by each of the devices.

In some embodiments, the step of processing the measured sound to identify target sounds generated by other devices comprises using a sound classifier to identify specific target sounds.

In other embodiments, the method further comprises the step of receiving signals from one or more other devices indicating whether specific sounds are being generated; wherein the received signals are used in the step of processing the measured sound to identify target sounds generated by other devices.

According to a second aspect of the invention, there is provided a computer program product, comprising computer readable code embodied therein, wherein the computer readable code is configured such that, on execution by a suitable computer or processing unit, the computer or processing unit is caused to perform the method described above.

According to a third aspect of the invention, there is provided a device for use in generating a target sound that is audible to a user of the device, the device comprising a microphone for measuring the background noise in the environment in which the device is located; a processing unit configured to: use a perceptual loudness model to predict the audibility of the target sound to a user of the device based on the measured background noise; use the output of the perceptual loudness model to determine a gain value that is to be applied to a source signal used to generate the target sound in order to provide at least a desired level of audibility of the target sound to the user; apply the determined gain value to the source signal to produce a modified source signal; and generate the target sound using the modified source signal; and a speaker for generating the target sound using the modified source signal.

Embodiments of the device are also contemplated in which the processing unit is configured to perform the methods in any of the embodiments and implementations described above.

In an embodiment the device comprises a sensor for monitoring or detecting a physiological parameter or characteristic of a patient. The processing unit processes the monitored or detected values of the physiological parameter or characteristic and in dependence thereof generates the source signal. In a further embodiment the device is a patient monitor that provides an alarm to a caregiver in dependence of a monitored physiological parameter of a patient.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE PREFERRED EMBODIMENTS

Although the invention is described below with reference to an apparatus in the form of a medical device that is for use in monitoring or treating a patient and that generates an alarm sound in the event that an alarm condition is detected with either the patient or the medical device, it will be appreciated that the technique of generating a specific or predetermined sound (also referred to as a 'target sound' herein) according to the invention so that it is highly audible in a noisy environment without being unnecessarily loud can be applied to many other types of electronic device that generate sound, such as portable music and video players, mobile communications devices, alarm clocks, televisions, computers, etc.

Figure 1:
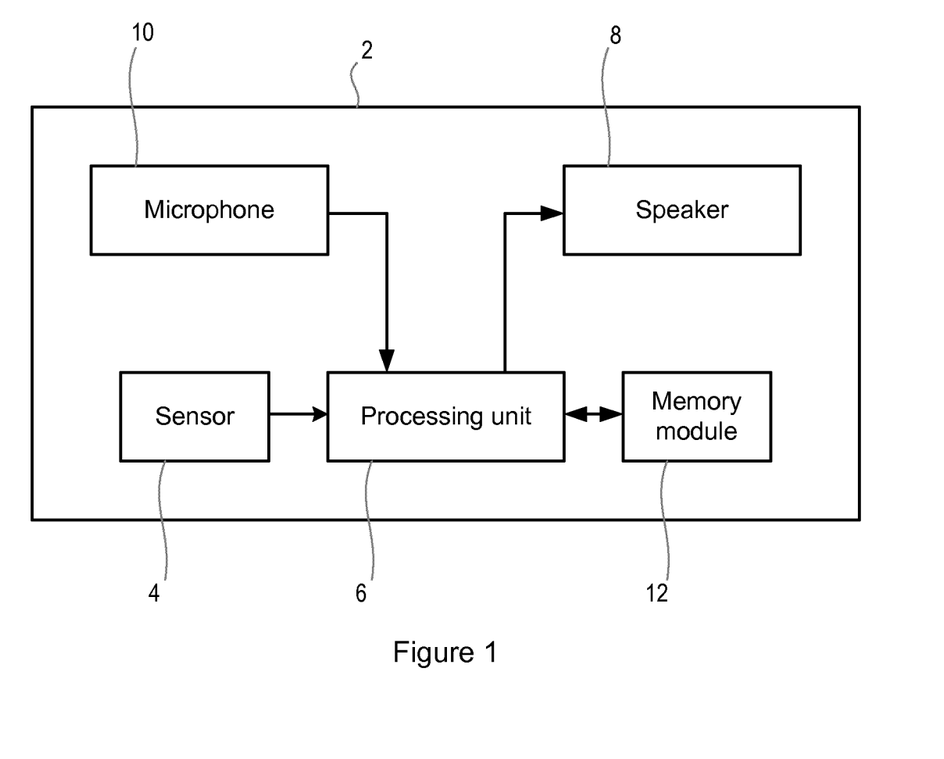
FIG. 1 is a block diagram of an apparatus according to an embodiment of the invention.

FIG. 1 shows an embodiment of the apparatus 2 according to the invention in the form of a medical device. It will be appreciated that FIG. 1 only shows the components of the device 2 that are useful for illustrating the invention, and in practice the device 2 will comprise additional components.

The device 2 comprises at least one sensor 4 for monitoring one or more physiological characteristics of a patient and/or for monitoring the operation of the device 2 (as appropriate depending on the purpose of the medical device). The device also comprises a processing unit 6 that is connected to the at least one sensor 4 and that controls the operation of the device 2. A speaker or audible alarm unit 8 is provided that is connected to the processing unit 6 and that is used to generate the specific or predetermined sound (for example an alarm) in response to an alarm condition being detected by the sensor 4 and processing unit 6.

The device 2 also comprises one or more microphones 10 that are connected to the processing unit 6 and that are used to measure the sound level around the device 2. In this embodiment where the device 2 is a medical device and the relevant user (i.e. the healthcare staff members for whom the alarm is intended to alert) will not necessarily be located right next to the device 2 when the alarm is generated (for example they may be elsewhere within the room in which the device 2 is located), it will be appreciated that the microphone(s) 10 can be placed in the room so that they can provide a good or realistic measure of the general background noise in the room at a position in which a user might be located. In some cases, the microphone(s) 10 can be suspended from the ceiling of the room.

A memory module 12 is provided that is connected to the processing unit 6 and that is used to store audio data or signals (e.g. in the form of a waveform) that are used to generate the specific or predetermined sound. The memory module 12 can also be used to store computer readable code containing instructions to the processing unit 6 for performing the processing algorithm according to the invention, and/or the background sounds or noise measured by the microphone(s) 10.

Briefly, the invention provides that the background sound level or noise in the environment around the device 2 is measured by the microphone(s) 10, and then a perceptual loudness model is used by the processing unit 6 to determine the level or volume at which the target sound (e.g. the alarm) should be generated by the speaker 8 in order for the target sound to have at least a predefined level of audibility to a user of the device 2 (for example healthcare staff in the case of a medical device 2). The processing unit 6 may determine the audibility as part of the perceptual loudness model by computing, for example, partial loudness (i.e. a measure of the loudness of a sound when particular background noise is present), the signal-to-background noise ratio, or any equivalent or similar measure known to those skilled in the art.

The perceptual loudness model run by the processing unit 6 models properties of the (human) auditory system and predicts whether a target sound a (e.g. an alarm) will be audible to a user in the presence of background sound or noise b (e.g. the background noise measured by the microphone 10). Perceptual loudness models predict a first threshold (i.e. a level or volume) at which the target sound becomes audible to a user. This threshold is also known as a 'detection' threshold and corresponds to the target sound having zero audibility.

The perceptual loudness model used by the processing unit 6 also predicts how the audibility of the target sound increases as the volume of the sound increases. A suitable model is suggested by the paper: Moore B. C. J., Glasberg B. R. & Baer T. (1997): A model for the prediction of thresholds, loudness, and partial loudness. J. Audio Eng. Soc. 45(4), 224-240) and those skilled in the art will be aware of other perceptual loudness models that could be used in implementing the invention. Then, according to the invention, the processing unit 6 uses the result of that prediction to determine the level or volume required for the target sound in order to achieve at least a desired level of audibility for the target sound. That determined level or volume is translated into a gain value that is to be applied to a signal used to generate the target sound so that the target sound is generated by the speaker 8 with the required audibility.

Figure 2:
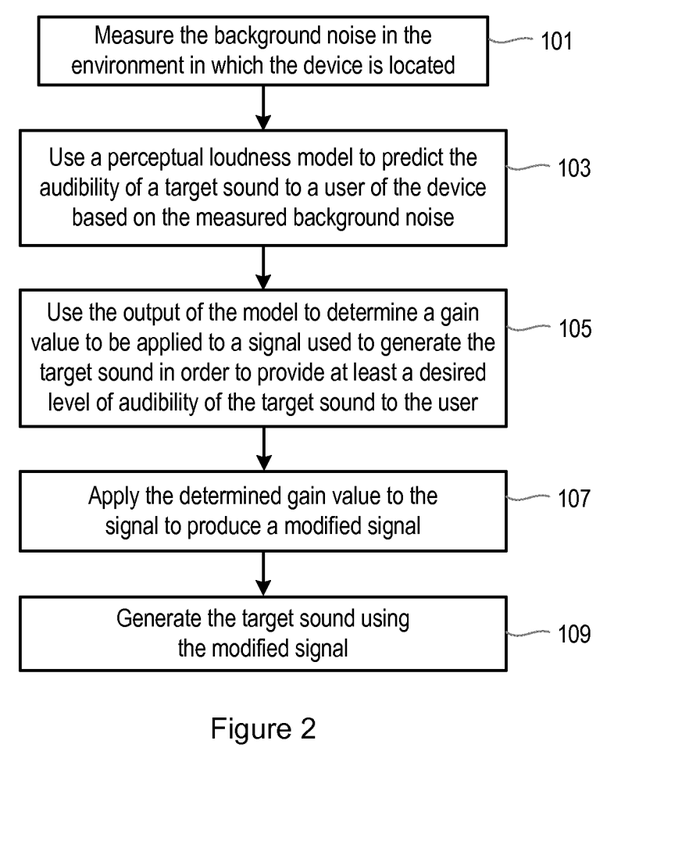
FIG. 2 is a flow chart illustrating a method of operating the apparatus of FIG. 1.
Figure 3:
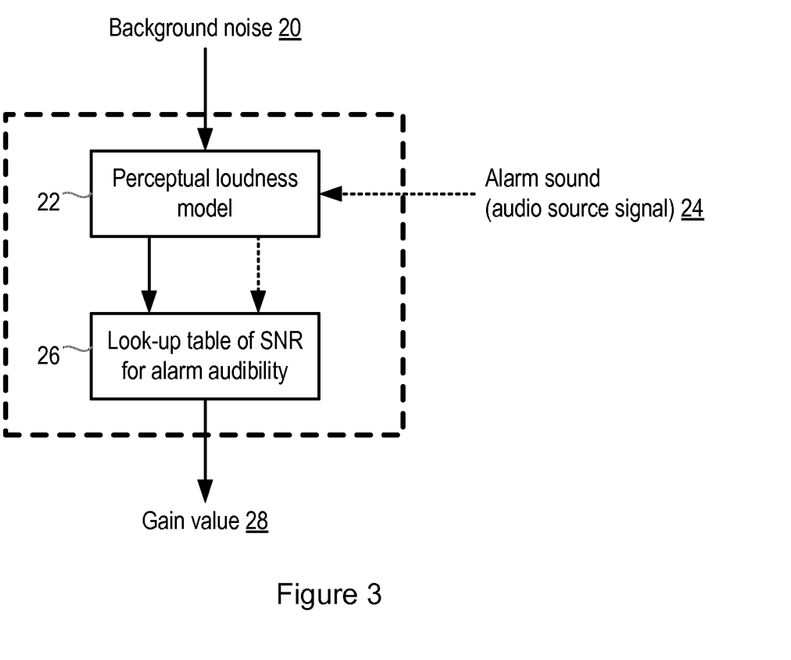
FIG. 3 is a block diagram illustrating the main processing steps performed by the processing unit according to a generalised embodiment.
Figure 4:
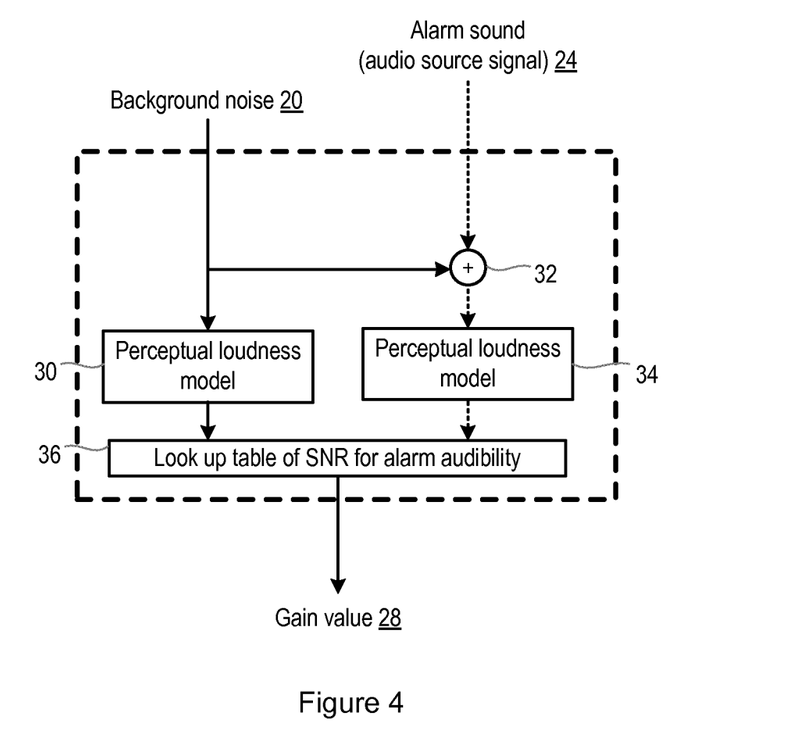
FIG. 4 is a block diagram illustrating the main processing steps performed by the processing unit according to a first specific embodiment.
Figure 5:
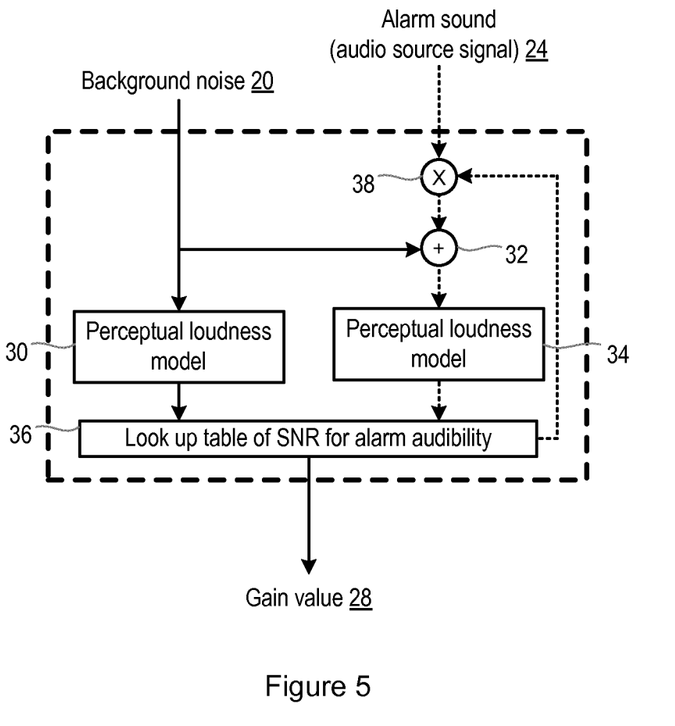
FIG. 5 is a block diagram illustrating the main processing steps performed by the processing unit according to a second specific embodiment.
Figure 6:
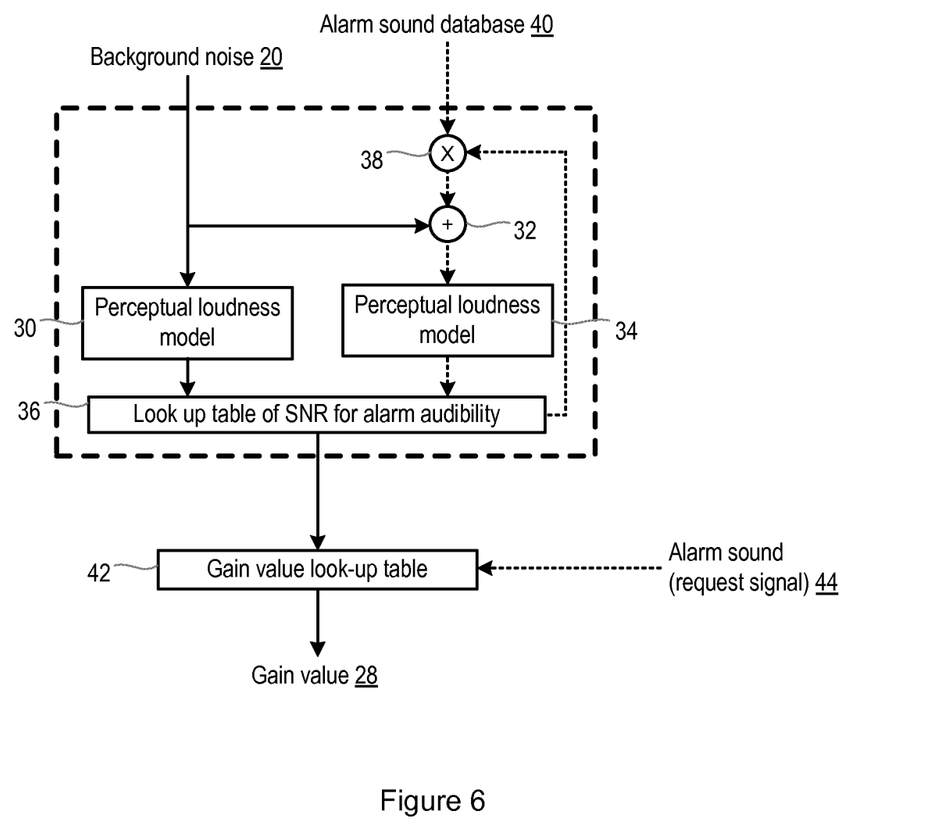
FIG. 6 is a block diagram illustrating the main processing steps performed by the processing unit according to another embodiment.

FIG. 2 illustrates a method of operating the apparatus according to an embodiment of the invention, and FIG. 3 is a block diagram illustrating the main processing steps performed by the processing unit 6 in a generalised embodiment. FIGS. 4, 5, and 6 show the main processing steps performed by the processing unit 6 according to specific preferred embodiments of the invention.

In a first step of the method, step 101, the background noise in the environment in which the device 2 is located is measured. As noted above, this measurement is performed by the microphone(s) 10, and the output of the microphone(s) 10 can be stored in the memory module 12 for subsequent analysis by the processing unit 6. In some embodiments the microphone(s) 10 can be used to continuously measure the sound level in the environment, but in other embodiments the microphone(s) 10 can be activated only when a target sound is to be generated (e.g. if an alarm is to be generated following an alarm condition being detected by the sensor 4).

Then, in step 103, the measured background noise (20 in FIG. 3) is input to a perceptual loudness model 22 along with the source signal 24 for the target sound (e.g. the waveform used to generate an alarm). The source signal 24 (e.g. alarm signal) may be preprocessed to take into account the acoustic path between the speaker 8 and the microphone 10, to ensure equivalence with that of the measured background noise. As described above, the perceptual loudness model 22 predicts the audibility of the target sound to a user of the device 2 in view of the measured background noise 20 as the volume of the sound increases.

The output of the model is used in step 105 to determine a gain or amplitude factor to be applied to the source signal 24 in order to provide at least a desired level of audibility of the target sound for the user (step 105). In some embodiments, a look-up table 26 is used to determine the required gain factor/value 28. The look-up table 26 may be designed such that, for a given background noise level and a given measure of audibility provided by the model 22, the table provides the required gain factor/value 28.

The gain value 28 is then applied to the source signal 24 by the processing unit 6 in step 107 to produce a modified source signal, and then in step 109, the modified source signal is used by the speaker 8 to generate the target sound having the desired audibility.

It will be appreciated that in some cases the method of FIG. 2 may be performed while a medical device 2 is already generating the alarm sound (or where another type of electronic device 2 is generating the target sound, e.g. music or other audio). This means that the device 2 continuously monitors the background noise level while the target sound is being generated and can adjust the volume of the target sound in response to changes in the background noise level.

In this case, to avoid the target sound generated by the speaker 8 from being considered as part of the background soundscape (i.e. background noise), the signals from the microphone(s) 10 are pre-processed by the processing unit 6 to remove the target sound. That is, the processing unit 6 receives the measured signals from the microphone(s) 10 and the source signal for the target sound and uses an adaptive filter (e.g. an equaliser) to filter or subtract the target sound out of the microphone signals to leave a signal that estimates the background noise. The estimate of the background noise is then used by the processing unit 6 with the perceptual loudness model to predict the audibility of the target sound to a user as described above in step 103.

It will also be appreciated that if the device 2 is being used in an environment in which other devices 2 according to the invention are present, it is possible that the operation of the invention in each those devices will lead to mutual amplification of the target sounds (alarm sounds) generated by each of the devices 2. Therefore, the processing unit 6 can pre-process the signals received from the microphone(s) 10 in order to remove the target sounds (alarm sounds) generated by the other devices 2. The processing unit 6 can achieve this in a variety of ways.

In one embodiment, the processing unit 6 can process the signals from the microphone(s) 10 using a sound classifier that can identify specific target sounds (e.g. alarm sounds) in the signals. Once identified, these signals can be filtered out of the background soundscape by the processing unit 6.

In another embodiment, for example where the device 2 can be interconnected with the other devices 2 (either using wires or wirelessly), the processing unit 6 can receive indications from the other devices 2 that a specific target sound (e.g. alarm) is being generated and/or the source signal for the specific target sounds, and the processing unit 6 can use this information to filter out the target sounds (e.g. alarms) generated by the other devices 2 from the signals received from the microphone(s) 10.

As noted above, FIGS. 4, 5, and 6 show the main processing steps performed by the processing unit 6 according to specific preferred embodiments of the invention. In the embodiments of FIGS. 4 and 5, the processing unit 6 uses the perceptual loudness model to evaluate how audible the target sound would be for a specific gain factor and background noise level 20. In particular, the processing unit 6 uses the model to compute the perceived loudness (also known as the partial loudness) of the target sound from both the background noise 20 and a composite signal formed from the background noise 20 and the target sound source signal 24. In these embodiments, the target sound generated using the determined gain value will be clearly audible, meaning that its level is clearly higher than the level at the threshold of audibility (i.e. the detection threshold).

In the embodiment of FIG. 6, the processing unit 6 uses the perceptual loudness model in computing the gain value for the target sound that corresponds to the threshold of audibility (i.e. the processing unit 6 finds an initial gain value that results in the perceived loudness/audibility output from this model being zero) and then extrapolates this initial gain value to a gain value that has an above-zero perceived loudness and that will guarantee audibility.

Thus, in the embodiment of FIG. 4, which is referred to as a two-path analyser, the processing unit 6 executes a first perceptual loudness model 30 using the measured background noise 20 to predict the audibility of the target (alarm) sound (where the measured background noise 20 has been pre-processed to remove any target sound signals generated by the device 2 or other devices 2).

The (pre-processed) measured background noise 20 is also combined with the audio source signal 24 representing the target sound using summing block 32 to provide a composite signal representing the background soundscape with the target sound added, and this composite signal is input to a second perceptual loudness model 34 that predicts the audibility of the target sound over the composite signal. The second perceptual loudness model 34 is the same or similar to the first perceptual loudness model 30. The processing unit 6 uses the outputs of both perceptual loudness models 30, 34 to determine the gain value 28 required to achieve at least a specified level of audibility from the look-up table 36, and uses the gain value 28 to generate the target sound with the required audibility. Look-up table 36 is similar to look-up table 26 described above.

The embodiment shown in FIG. 5 is based on that shown in FIG. 4, but the process of gain value calculation is extended and made recursive. Here, the gain value 28 for the target sound is not only predicted from the model calculations and the use of a look-up table 36, but it is used to recursively compute the perceived loudness for the combination of the background noise 20 plus the target sound 24 with the new gain value 28 applied. To provide this functionality, the gain value 28 obtained from the look-up table 36 is multiplied with the audio source signal 24 in multiplication block 38 to form an intermediate modified signal representing the target sound with the current gain and the output of this block 38 is input to summing block 32. Thus, the second perceptual loudness model 34 predicts the audibility of the target sound in view of the composite signal representing the background soundscape plus the intermediate modified signal.

This feedback loop is run until the output of the second perceptual loudness model 34 indicates that the required audibility will be achieved for the target sound. Although this embodiment is likely to be slower to compute the required gain value 28 than the embodiment in FIG. 4, it is likely to produce a more accurate result for the gain value.

In some embodiments, particularly where the device 2 is a medical device, it may be the case that the device 2 can generate alarms for a number of different reasons, with those alarms conveying alerts with different priority levels. For example, a medical device 2 in the form of a heart rate monitor may generate a first alarm if the measured heart rate exceeds a threshold value, and a second higher priority alarm if the measured heart rate falls below another threshold value. In this case, each alarm 'reason' may have a respective desired level of audibility that is linked to the priority of the alarm which the processing unit 6 can take into account in the method of FIG. 2 to generate high priority alarms with a higher audibility than low priority alarms.

In a further embodiment of the invention, the processing unit 6 can use the models 22, 30 or 34 to predict how likely an alarm sound will be to wake a nearby patient if they are sleeping and to adjust the determined gain value accordingly. In this case, the device 2 may be provided with some means for establishing whether the patient is sleeping and/or the sleep stage of the patient. Suitable means can include actigraphy sensors, polysomnography sensors or visual sensors (such as cameras) that allow the current state of the patient to be determined.

It will be appreciated that the above embodiments in which mutual amplification of target sounds (particularly alarm sounds) is avoided can also be applied to devices that do not make use of a perceptual loudness model to predict the audibility of a target sound. In those devices, where the volume or level required to generate the target sound may be determined directly from the background noise level, the background noise signal can be pre-processed as described above to remove alarm sounds generated by other devices.

Although the invention has been described above with reference to a single device 2, it will be appreciated that it is possible for a device containing a processing unit 6 as described above to be provided that is used to control the volume of alarm signals and other sounds issued by multiple devices 2 in a particular room or environment.

In this case, in order to be ready to provide an appropriate gain value for any given alarm in the set of multiple devices 2, the processing unit 6 can effectively pre-process the measured background noise using information about the different devices 2 (such their respective alarm waveforms, the frequency with which they are issued, their duration, etc.) and then retrieve the appropriate gain value when an alarm for a specific device 2 is to be generated.

The specific embodiment shown in FIG. 6 illustrates the processing steps performed by the processing unit 6 to manage multiple sound-generating devices 2 (however it will be appreciated that the core processing arrangement shown in FIG. 6 could be applied to a single device 2 as in FIGS. 4 and 5 above). This embodiment is structurally similar to that shown in FIG. 5, however in this embodiment the processing unit 6 has access to an alarm sound database 40 (for example stored in memory module 12) that stores information about the variety of alarm-sound generating devices (e.g. frequency, duration of alarm sounds, etc.) and that provides the inputs to the second perceptual loudness model 34 in turn to determine a gain value for each of the devices 2 or individual alarms in order for the target (alarm) sound to be audible. These gain values are stored in a look-up table 42. The processing unit 6 can analyse the current background noise level intermittently and update the look-up table 42 as required. When a specific device 2 needs to generate an alarm, a request signal 44 will be received at the processing unit 6 and the appropriate gain value for that device 2 is retrieved from the look-up table 42 and output by the processing unit 6 to the device 2.

There is therefore provided an apparatus and method of operating the same that generates a specific or predetermined sound, for example an alarm, which reduces the potential negative impacts of the sounds on users, while ensuring that the sounds remain highly audible without being unnecessarily loud.

While the invention has been illustrated and described in detail in the drawings and foregoing description, such illustration and description are to be considered illustrative or exemplary and not restrictive; the invention is not limited to the disclosed embodiments.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of operating a device to generate a target sound that is audible to a user of the device, the method comprising:
    measuring background noise in an environment in which the device is located;
    using a perceptual loudness model to predict an audibility of the target sound to the user of the device in the presence of the measured background noise, said step comprising using the perceptual loudness model to compute a perceived loudness of the target sound from the measured background noise and a composite signal formed by adding the source signal for the target sound to the measured background noise;
    using an output of the perceptual loudness model to determine a gain value that is to be applied to a source signal used to generate the target sound in order to provide at least a desired level of audibility of the target sound to the user;
    applying the determined gain value to the source signal to produce a modified source signal; and
    generating the target sound using the modified source signal.

2. A method as claimed in claim 1, wherein the step of using the perceptual loudness model comprises computing a measure of a loudness of the target sound in view of the measured background noise.

3. A method as claimed in claim 1, wherein the perceptual loudness model is used to predict a first threshold at which the target sound becomes audible to the user, and to predict how the audibility of the target sound to the user increases as the volume of the target sound increases.

4. A method as claimed in claim 3, wherein the step of using the output of the perceptual loudness model comprises using the prediction of how the audibility of the target sound to the user increases as the volume of the target sound increases to determine the level or volume required for the target sound in order to achieve at least a desired level of audibility for the target sound.

5. A method as claimed in claim 4, wherein the step of using the output of the perceptual loudness model further comprises determining the gain value appropriate for the determined level or volume required for the target sound.

6. A method as claimed in claim 1, wherein the step of using the output of the perceptual loudness model to determine a gain value comprises using a look-up table that provides the gain value required for the predicted audibility of the target sound and the measured background noise.

7. A method as claimed in claim 1, wherein the step of using a perceptual loudness model to predict the audibility of the target sound comprises evaluating how audible the target sound would be for a specific gain value and the measured background noise.

8. A method as claimed in claim 1, wherein the step of using a perceptual loudness model is repeated after a gain value is determined in the step of using the output of the perceptual loudness model to determine a gain value, and
    wherein, when the step of using a perceptual loudness model is repeated, the composite signal is formed by applying the gain value to the source signal for the target sound to produce an intermediate modified signal and adding the intermediate modified signal to the measured background noise.

9. A method as claimed in claim 1, further comprising pre-processing the source signal in order to account for the acoustic path between a speaker of the device and the means provided in the device for measuring the background noise.

10. A method as claimed in claim 1, wherein, in the event that the method is performed when the device is already generating the target sound, the step of measuring the background noise in the environment in which the device is located comprises:
measuring the sound in the environment in which the device is located; and
filtering or subtracting the source signal for the target sound from the measured sound to give the measured background noise.

11. A method as claimed in claim 1, wherein the step of measuring the background noise in the environment in which the device is located further comprises:
measuring the sound in the environment in which the device is located;
processing the measured sound to identify target sounds generated by other devices; and in the event that target sounds generated by other devices are identified in the measured sound, processing the measured sound to remove said target sounds generated by other devices to give the measured background noise.

12. A method of operating a device to generate a target sound that is audible to a user of the device, the method comprising:
measuring background noise in an environment in which the device is located;
using a perceptual loudness model to predict an audibility of the target sound to the user of the device in the presence of the measured background noise;
using an output of the perceptual loudness model to determine a gain value that is to be applied to a source signal used to generate the target sound to provide at least a desired level of audibility of the target sound to the user, said step comprising:
using the output of the perceptual loudness model to determine an initial gain value to be applied to the source signal that results in a perceived loudness of zero; and
extrapolating the initial gain value to a gain value that has an above-zero perceived loudness;
applying the determined gain value to the source signal to produce a modified source signal; and
generating the target sound using the modified source signal.

13. A non-transitory machine-readable storage medium comprising instructions for execution by a suitable computer or processing unit, the non-transitory machine-readable medium comprising:
instructions for measuring background noise in an environment in which the device is located;
instructions for using a perceptual loudness model to predict an audibility of the target sound to the user of the device in the presence of the measured background noise by using the perceptual loudness model to compute a perceived loudness of the target sound from the measured background noise and a composite signal formed by adding the source signal for the target sound to the measured background noise;
instructions for using an output of the perceptual loudness model to determine a gain value that is to be applied to a source signal used to generate the target sound to provide at least a desired level of audibility of the target sound to the user;
instructions for applying the determined gain value to the source signal to produce a modified source signal; and
instructions for generating the target sound using the modified source signal.

14. A non-transitory machine-readable storage medium as claimed in claim 13, wherein the instructions for using a perceptual loudness model to predict the audibility of the target sound comprise;
instructions for evaluating how audible the target sound would be for a specific gain value and the measured background noise.

15. A device for use in generating a target sound that is audible to a user of the device, the device comprising:
a microphone for measuring background noise in an environment in which the device is located;
a processing unit configured to:
use a perceptual loudness model to predict an audibility of the target sound to the user of the device in the presence of the measured background noise by using the perceptual loudness model to compute a perceived loudness of the target sound from the measured background noise and a composite signal formed by adding the source signal for the target sound to the measured background noise;
use an output of the perceptual loudness model to determine a gain value that is to be applied to a source signal used to generate the target sound in order to provide at least a desired level of audibility of the target sound to the user;
apply the determined gain value to the source signal to produce a modified source signal; and
generate the target sound using the modified source signal; and a speaker for generating the target sound using the modified source signal.

16. A device according to claim 15 further comprising a sensor for monitoring a physiological parameter of a patient, the processing unit being configured to generate the source signal in dependence of the monitored physiological parameter.

17. A medical instrument or system for detecting a physiological parameter and controlling an alarm comprising the device according to claim 15.

18. A non-transitory machine-readable storage medium comprising instructions for execution by a suitable computer or processing unit, the non-transitory machine-readable medium comprising:
instructions for measuring background noise in an environment in which the device is located;
instructions for using a perceptual loudness model to predict an audibility of the target sound to the user of the device in the presence of the measured background noise;
instructions for using an output of the perceptual loudness model to determine a gain value that is to be applied to a source signal used to generate the target sound to provide at least a desired level of audibility of the target sound to the user;
instructions for applying the determined gain value to the source signal to produce a modified source signal; and
instructions for generating the target sound using the modified source signal;
wherein the instructions for using the output of the perceptual loudness model to determine a gain value comprise:
instructions for using the output of the perceptual loudness model to determine an initial gain value to be applied to the source signal that results in a perceived loudness of zero; and
instructions for extrapolating the initial gain value to a gain value that has an above-zero perceived loudness.

19. A non-transitory machine-readable storage medium as claimed in claim 18, wherein the instructions for using a perceptual loudness model are configured to be executed again after a gain value is determined according to the instructions for using the output of the perceptual loudness model to determine a gain value, and wherein, when instructions for using a perceptual loudness model are executed again, the composite signal is formed by applying the gain value to the source signal for the target sound to produce an intermediate modified signal and adding the intermediate modified signal to the measured background noise.

\* \* \* \* \*